(12) United States Patent
Matsuoka (10) Patent No.: US 7,215,455 B2
(45) Date of Patent: May 8, 2007

(54) INNER DRUM EXPOSURE APPARATUS

(75) Inventor: Hiroshi Matsuoka, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 0 days.

(21) Appl. No.: 11/342,722

(22) Filed: Jan. 31, 2006

(65) Prior Publication Data
US 2006/0181754 A1    Aug. 17, 2006

(30) Foreign Application Priority Data
Jan. 31, 2005    (JP) .............................. 2005-023673

(51) Int. Cl.
*G02B 26/08* (2006.01)
(52) U.S. Cl. ...................... 359/222; 359/207; 359/211; 359/833
(58) Field of Classification Search ...................... None
See application file for complete search history.

(56) References Cited
U.S. PATENT DOCUMENTS 5,367,399 A * 11/1994 Kramer ...................... 359/206
5,825,555 A * 10/1998 Oono et al. .................. 359/668
6,121,996 A    9/2000 Gelbart
6,369,929 B2    4/2002 Takada

FOREIGN PATENT DOCUMENTS

JP    10-133132 A    5/1998

* cited by examiner

*Primary Examiner*—James Phan
(74) *Attorney, Agent, or Firm*—Sughrue Mion, PLLC (57) ABSTRACT

The inner drum exposure apparatus records an image by scanning a recording material held on an arcuate inner peripheral surface of a support with a light beam that is emitted from a light source and modulated in accordance with image information and deflected by a total reflection mirror plane of a rotatably driven scanning device such as a spinner. The scanning device includes a first cylindrical lens for condensing the incident light beam incident into the total reflection mirror plane along a first plane containing an optical axis of the light beam and a second cylindrical lens for scattering the light beam along a second plane orthogonal to the first plane. The incident light beam is shaped into a beam spot of an elliptical configuration whose major axis is orthogonal to a beam deflecting/scanning direction by the first and second cylindrical lenses.

8 Claims, 5 Drawing Sheets

INNER DRUM EXPOSURE APPARATUS

The entire contents of literatures cited in this specification are incorporated herein by reference.

BACKGROUND OF THE INVENTION

The present invention relates to an inner drum exposure apparatus that records an image by scanning a recording material held on the arcuate inner peripheral surface of a support with a light beam that was modulated in accordance with image information and deflected by a total reflection mirror plane of a rotatably driven scanning means and, more specifically, to an inner drum exposure apparatus that is capable of consistent halftone recording.

An inner drum exposure apparatus is generally used in which a light beam such as a laser beam is guided to the photosensitive surface of a recording material held on the inner peripheral surface of a cylindrical or drum-shaped support to scan the recording material through exposure (see, for example, JP 10-133132 A). The recording material on which an image has been recorded through exposure is processed as needed in an automatic developing machine, whereby a latent image formed on the recording material is converted to a visible image.

When the halftone is represented through exposure of a recording material, the inner drum exposure apparatus commonly represents the halftone in a dot shape through AM screening (technique to form a halftone dot image into a gradation image). In AM screening, the minimum unit of a halftone dot image is composed of a large number of dots, for example, 14 (horizontal dots)×14 (vertical dots), i.e., 196 dots in total. Such a halftone dot image is arranged on a two-dimensional plane to record a gradation image. However, when AM screening is used to represent the halftone, moiré fringes or tone jump (discontinuous change in gradation) may often occur.

FM screening is also available as a technique to form a halftone dot image into a gradation image. FM screening represents gradations in a recorded image depending on how densely dots of indefinite shape having no regularity are packed. The gradations are represented by arranging an image composed of a relatively small number of dots, e.g., 2×2 dots, i,e., 4 dots in total, on a two-dimensional plane in a dispersed manner. FM screening is advantageous in that moiré fringes can be suppressed based on its principle.

For this reason, also in an inner drum exposure apparatus capable of achieving high productivity, it has been desired to represent the halftone with small dots through FM screening.

However, in a usual inner drum exposure apparatus configured so that a light beam emitted from a laser light source of a single lateral mode is imaged on the scanning surface of a recording material to form an image, a beam spot is formed so as to exhibit a Gaussian distribution. When performing pixel recording through exposure with a beam spot exhibiting such a Gaussian distribution, the device is usually designed such that the half-width of the beam spot can be equal to or larger than the pixel size to prevent gaps from being formed between scanning lines.

In the case of an image recorded by exposing through FM screening with a light beam having a spot whose edge portion is relatively gentle, the size of recording pixels is changed due to fluctuations in optical power, the degree to which development is effected by an automatic developing machine or other factor, which may abruptly change the ratio in a halftone dot image (halftone dot area ratio), leading to large gradation changes. The above design is done to prevent such a situation.

However, the above measure does not solve the problem that it is difficult to represent the halftone with small dots by using FM screening in an inner drum exposure apparatus, because the beam spot is formed so as to exhibit a Gaussian distribution.

In this regard, U.S. Pat. No. 6,121,996 discloses a technique for directly imaging a light source image from a light source retaining a linear light-emitting surface. However, application of this technique to an inner drum exposure apparatus requires mounting a light source above a deflector and rotating it to allow a linear spot orthogonal to the scanning direction to be formed at an arbitrary position on the inner drum, and as a result this involves an increase in the size of the deflector and a reduction in the scanning speed.

SUMMARY OF THE INVENTION

The present invention has been made under these circumstances and it is an object of the present invention to solve the conventional problems by providing an inner drum exposure apparatus capable of consistent halftone recording.

In order to achieve the above object, the present invention provides an inner drum exposure apparatus, comprising:
a support having an arcuate inner peripheral surface on which a recording material on which an image is recorded is held;
a light source for emitting a light beam;
modulating means for modulating in accordance with image information of the image the light beam emitted from the light source;
scanning means being rotatably driven and having a total reflection mirror plane, the scanning means for scanning the recording material held on the arcuate inner peripheral surface of the support with the light beam that is modulated in accordance with the image information by the modulating means and deflected by the total reflection mirror plane of the rotatably driven scanning means, wherein
the image is recorded on the recording material by scanning the recording material with the modulated light beam,
the scanning means comprises:
a first cylindrical lens for condensing the modulated light beam incident into the total reflection mirror plane along one first plane containing an optical axis of the incident light beam; and
a second cylindrical lens for diverging the incident light beam along one second plane orthogonal to the one first plane containing the optical axis, and
the incident light beam is shaped into a beam spot of an elliptical configuration whose major axis is orthogonal to a beam deflecting/scanning direction by the first cylindrical lens and the second cylindrical lens.

In a preferred embodiment, the first cylindrical lens is a convex cylindrical lens and the second cylindrical lens is a concave cylindrical lens.

In another preferred embodiment, the first cylindrical lens is a concave cylindrical lens and the second cylindrical lens is a convex cylindrical lens.

It is preferred that the total reflection mirror plane of the scanning means be formed by a prism, and that at least one of the first and second cylindrical lenses be directly formed on an incidence/emission surface of the prism.

At least one of the first cylindrical lens and the second cylindrical lens is preferably a Fresnel-type cylindrical lens.

It is preferred that the total reflection mirror plane of the scanning means be formed by a prism, and that the Fresnel-type cylindrical lens be attached to a prism surface of the prism of the scanning means.

It is also preferred that the total reflection mirror plane of the scanning means be formed by a prism, and that the Fresnel-type cylindrical lens be directly formed on a prism surface of the prism of the scanning means.

The scanning means preferably has a balance adjusting member which is substantially identical in weight to the second cylindrical lens and which is provided on a surface of the scanning means opposite to the second cylindrical lens with respect to the optical axis.

The present invention has a marked effect of realizing an inner drum exposure apparatus capable of consistent halftone recording.

More specifically, the present invention having a relatively simple configuration can form a beam spot so that the beam diameter in the main scanning direction is smaller than that in the sub scanning direction, whereby the edge portion in the main scanning direction can be made steep. Thus, exposure using such a beam spot produces an effect of consistent halftone recording.

DESCRIPTION OF THE PREFERRED EMBODIMENTS

In the following, the present invention will be described in detail with reference to the preferred embodiments shown in the attached drawings.

Figure 1:
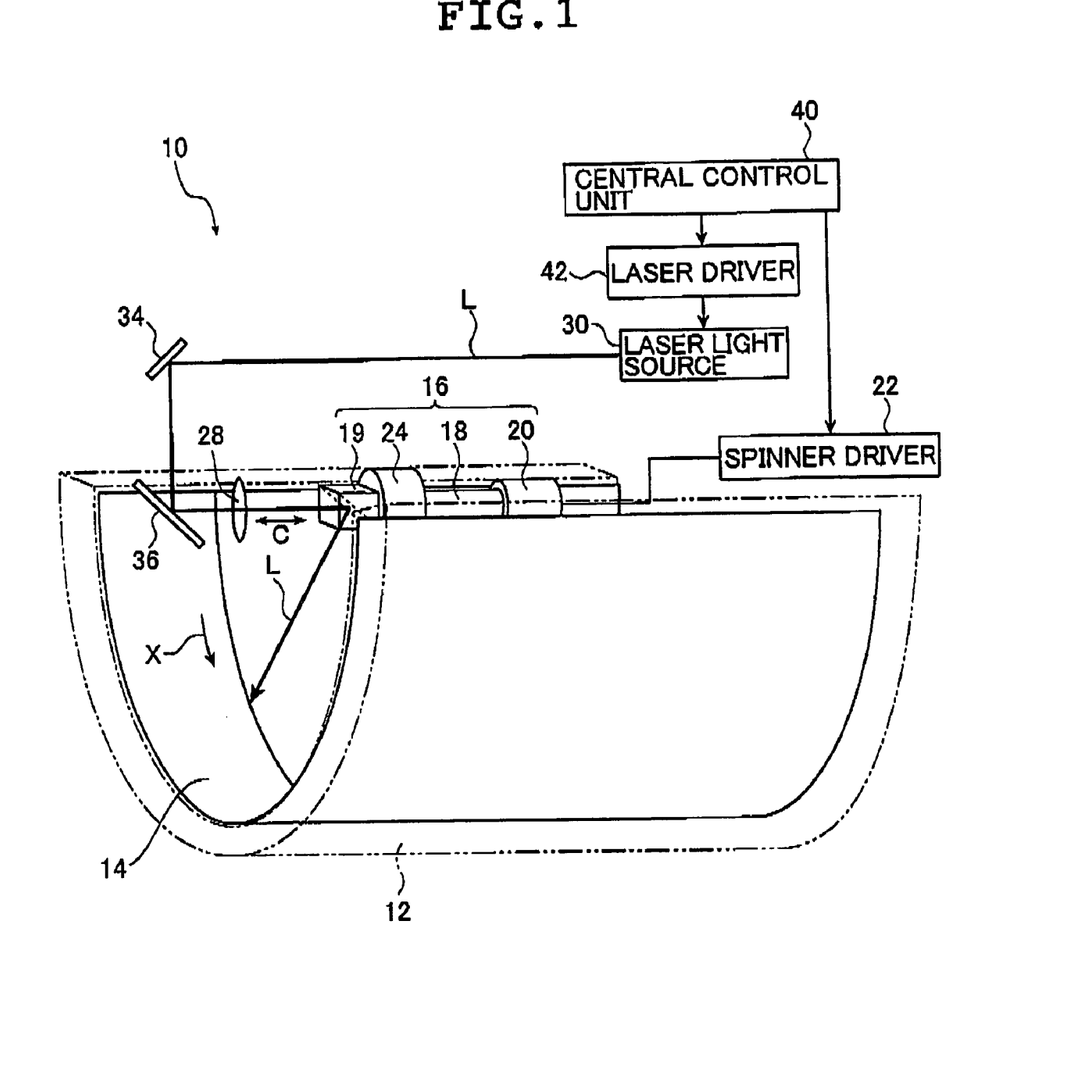
FIG. 1 schematically shows the configuration of an inner drum exposure apparatus according to an embodiment of the present invention.

FIG. 1 schematically shows the configuration of an inner drum exposure apparatus according to an embodiment of the present invention. The characteristic feature of the inner drum exposure apparatus according to the embodiment under consideration is that, in order to allow the halftone to be represented with small dots, FM screening is used to form a beam spot so that the beam diameter in the main scanning direction is smaller than that in the sub scanning direction, which is as described above.

As shown in FIG. 1, an inner drum exposure apparatus 10 according to this embodiment includes as its base a support 12 having a shape constituting part of the inner peripheral surface of a cylinder. A recording material 14 (photopolymer plate or an ordinary PS plate) is supported on the inner peripheral surface of the support 12.

A supply/discharge unit (not shown) in the inner drum exposure apparatus 10 supplies the recording material 14 on which recording is not performed yet, to the support 12 so that the recording material 14 is surely brought into intimate contact with the inner peripheral surface of the support 12, subjects the supplied recording material 14 to exposure, and discharges the exposed recording material 14 from the support 12 to the exterior.

A spinner mirror unit 16 serving as a scanning means is provided at the central position of the arc-shaped support 12 in the inner drum exposure apparatus 10 of this embodiment. The spinner mirror unit 16 is configured such that a drive source, that is, a motor 20 is capable of rotating a cylindrical rotary shaft 18 around its central axis (which coincides with the central axis of the arc-shaped support 12).

A cube prism 19 having a total reflection mirror plane 19B to be described later is provided at the forward end of the rotary shaft 18 of the spinner mirror unit 16 so as to form an angle of 45 degrees with respect to the rotary shaft 18. The cube prism 19 has a cylindrical lens 21A with a convex section and a cylindrical lens 21B with a concave section on the beam incidence side and the beam emission side of the cube prism 19, respectively. The structure will be described in detail below.

The spinner mirror unit 16 described above is moved for scanning at a constant speed in the axial directions (indicated by a double-headed arrow C in FIG. 1) on the central axis of the arch-shaped support 12 by a sub scanning moving means (not shown). In the spinner mirror unit 16, a spinner driver 22 controls the rotation speed of the motor 20 and the sub scanning moving means controls the movement of the unit 16 in the sub scanning direction.

The characteristic operation of the inner drum exposure apparatus 10 of this embodiment is as follows: A beam is formed (into an elliptical shape in this embodiment), and the formed beam is used to perform main scanning in the direction indicated by an arrow X in FIG. 1 on the recording surface of the recording material 14 disposed (set) on the inner peripheral surface of the support 12.

The above-mentioned cube prism 19 which includes a prism 19C having the total reflection mirror plane 19B and a prism 19A is disposed at the rear of a condenser lens 28 on the light source side (on the side farther from a light source). As described above, the cylindrical lens with a convex section (hereinafter simply referred to as the convex cylindrical lens) 21A and the cylindrical lens with a concave section (hereinafter simply referred to as the concave cylindrical lens) 21B are provided on the beam incidence side and the beam emission side of the cube prism 19, respectively.

Figure 2:
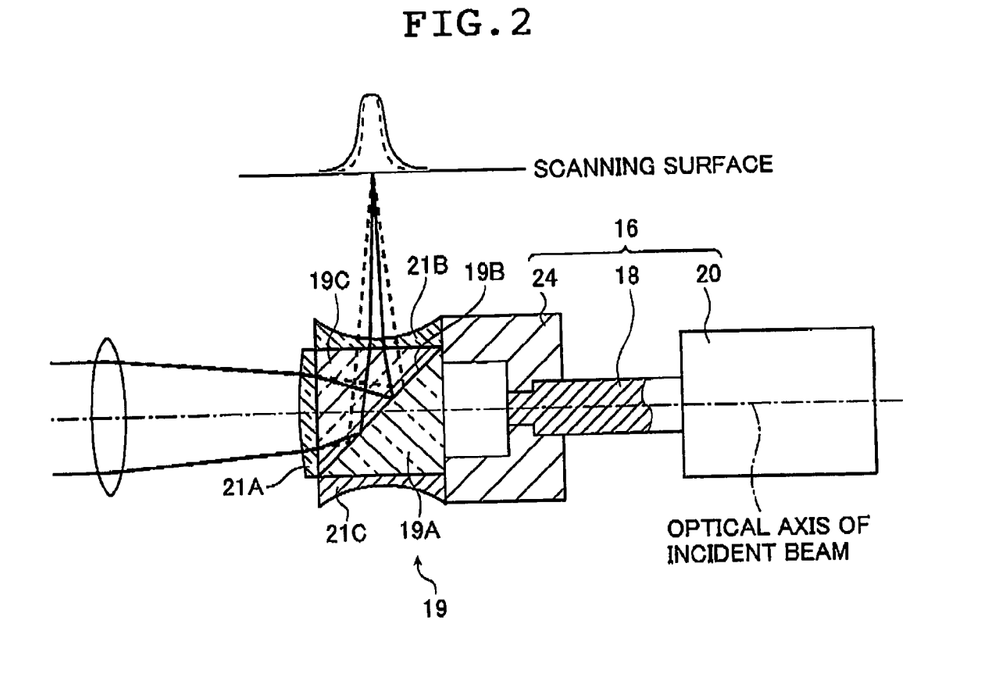
FIG. 2 is a detail view showing the configuration of a spinner mirror unit in the inner drum exposure apparatus shown in FIG. 1.

FIG. 2 shows a specific structure of the cube prism 19. The cube prism 19 including the convex cylindrical lens 21A and the concave cylindrical lens 21B is firmly held by a holder 24 which is engaged with the rotary shaft 18 so as to integrally rotate with the rotary shaft 18 of the spinner mirror unit 16.

In order to form a beam spot so that the beam diameter in the main scanning direction is smaller than that in the sub scanning direction as described above (in other words, in order to obtain an elliptical beam spot which is elongated in the sub canning direction), the beam diameter in the main scanning direction of the incident light beam is reduced by the convex cylindrical lens 21A, and then enlarged by the concave cylindrical lens 21B.

More specifically, the convex cylindrical lens 21A is provided on the incidence side of the cube prism 19 that is a cubic block composed of the prism 19C with the total reflection mirror plane 19B and the prism 19A formed symmetrically with respect to the prism 19C. The concave cylindrical lens 21B is provided on the side of the cube prism 19 toward which the light beam having entered the cube prism 19 through the convex cylindrical lens 21A travels after having been reflected from the total reflection mirror plane 19B.

The respective components are firmly bonded together as a whole into an integral unit. Further, the cube prism 19 is firmly attached to the holder 24 fixed to the rotary shaft 18. In order to be fully compatible with the high-speed rotation of the spinner mirror unit 16, the respective components are configured so as to have a very exact symmetry with respect to the central axis of the rotary shaft which coincides with the optical axis of the incident light beam.

As seen from the upper portion of FIG. 2, passage of the incident light beam through the cube prism 19 of this embodiment along the optical path allows the initial beam shape (indicated by a dashed line of FIG. 2) of the incident light beam to be enlarged in the sub scanning direction to obtain a shape (as indicated by a solid line of FIG. 2).

Regarding the focal distances of the convex cylindrical lens 21A and the concave cylindrical lens 21B, these lenses are designed such that the focal position of the light beam after the reduction/enlargement by these lenses coincides with the focal position when the light beam is not transmitted through the convex cylindrical lens 21A and the concave cylindrical lens 21B but is only transmitted through the condenser lens 2B.

Regarding the beam diameter in the main scanning direction of the light beam, the incidence direction of the light beam coincides with the axial directions of the two cylindrical lenses and hence the light beam is not dispersed but is maintained in a sharp form without any changes. As a result, in this embodiment, the light beam emitted from the cube prism 19 has an oblate ellipsoidal shape and its diameter in the main scanning direction is reduced. This will be discussed later in detail with reference to FIGS. 3 and 6.

Figure 3:
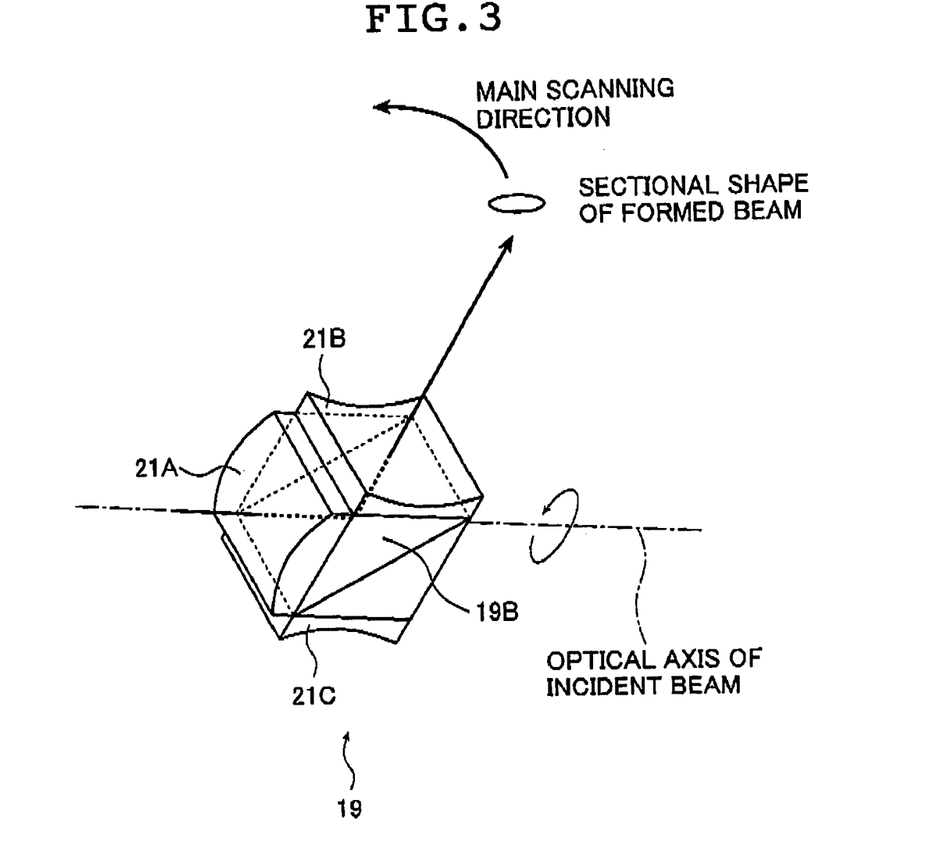
FIG. 3 is a detail view showing the structure of a cube prism used in the spinner mirror unit shown in FIG. 2.

First, FIG. 3 is a perspective view showing the structure of the cube prism 19 of this embodiment in detail. In FIG. 3, reference symbol 21A denotes the convex cylindrical lens, reference symbol 21B denotes the concave cylindrical lens, and reference symbol 21C denotes a dummy (prism) for balance adjustment having the same weight as the concave cylindrical lens 21B.

In FIG. 3, in the incidence/emission plane (the plane on which the incident light La and the emission light Lb pass), the light beam entering from-the left-hand side is first reduced by the convex cylindrical lens 21A, and then reflected upwardly (at right angles in this case) from the total reflection mirror plane 19B of the cube prism 19. Further, the reflected light beam is enlarged by the concave cylindrical lens 21B. This operation has been described above with reference to FIG. 2.

The sectional shape of the light emitted from the emission surface (sectional shape of the light beam formed) was shown in FIG. 3. As described above, in this embodiment, it is possible to obtain a beam which has a small oblate ellipsoidal section and whose beam diameter is smaller in the main scanning direction than in the sub scanning direction, and hence to record higher-quality images than in conventional exposure apparatuss by performing image recording on a recording material in the inner drum exposure apparatus using such a light beam.

Figure 4:
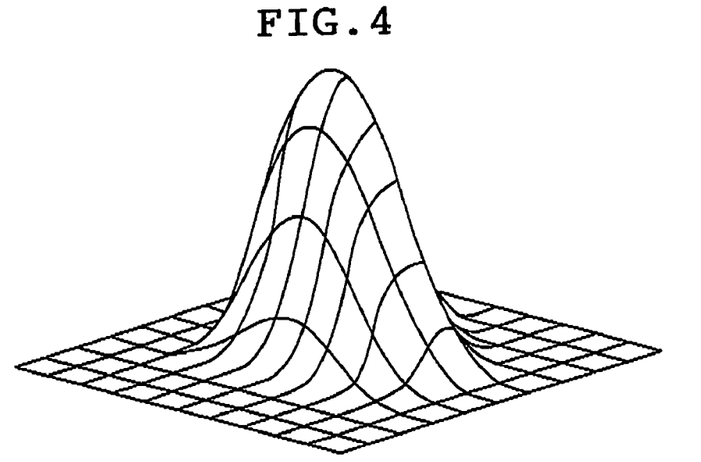
FIG. 4 shows a beam spot of an oblate ellipsoidal shape formed in the inner drum exposure apparatus shown in FIG. 1.

In the case of the above-mentioned light beam which has a small oblate ellipsoidal section and whose beam diameter is smaller in the main scanning direction than in the sub scanning direction, the length in the sub scanning direction of the light beam with a Gaussian distribution having a half-width of 5 µm is enlarged as shown in FIG. 4, so that the resultant light beam is sharp in the main scanning direction.

Figure 5:
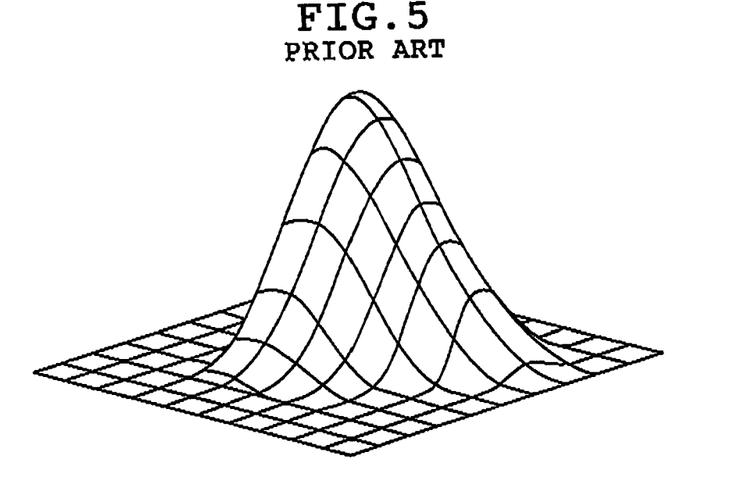
FIG. 5 shows a beam spot formed by a conventional technique.

FIG. 5 shows the shape of a conventional beam spot with a Gaussian distribution having a half-width of 8.8 µm ($1/e^2$ width: 15 µm). The comparison between the above case and the case shown in FIG. 5 in which the conventional beam spot with a Gaussian distribution has a gently flaring shape in the main scanning direction clearly shows the difference in the effect achieved.

In this embodiment, the dummy 21C with substantially the same weight as the concave cylindrical lens 21B is arranged on the opposite side (reverse side) to the concave cylindrical lens 21B of the cube prism 19. As a result, the weight balance of the cube prism 19 as a whole during the rotation is ensured, which allows the spinner mirror unit 16 of the inner drum exposure apparatus 10 to be stably rotated at a high speed.

The optical system on the light source side in this embodiment includes a semiconductor laser light source (LD) 30 (see FIG. 1) for outputting a laser beam L, and a condensing optical system for condensing the laser beam L emitted from the semiconductor laser light source 30 on the exposure surface of the recording material 14. As the semiconductor laser light source 30, it is possible to use a single lateral mode semiconductor laser having an intensity distribution in which the central light intensity is high, and the light intensity gradually decreases as the distance from the center increases.

In the inner drum exposure apparatus 10 of this embodiment, the beam formed in an oblate ellipsoidal shape is emitted from the cube prism 19, is condensed/impinges on the exposure surface of the recording material 14 set on the inner peripheral surface of the support 12 of the inner drum exposure apparatus 10 so that the beam spot at the condensing point has an oblate ellipsoidal shape in the sub scanning direction, and then is subjected to exposure.

In the inner drum exposure apparatus 10 of this embodiment, an image is recorded on the recording material 14 while the spinner mirror unit 16 and the semiconductor laser light source 30 are controlled by a central control unit 40 as shown in FIG. 1. In the inner drum exposure apparatus 10, image information for exposure is input from an input unit (not shown), and an exposure start command is transmitted to the central control unit 40. Then, the central control unit 40 transmits an image signal to a laser driver 42 based on the image information.

The laser driver 42 controls the drive of the semiconductor laser light source 30 so that the laser beam L modulated based on the image signal is emitted to be incident on the spinner mirror unit 16 through the optical system on the light source side. At the same time, the central control unit 40 controls the drive of the motor 20 so that the recording material 14 set on the support 12 is exposed for scanning in the main scanning direction with the light incident from the optical system on the light source side on the spinner mirror unit 16 (cube prism 19). The central control unit 40 also transmits a control signal to the spinner driver 22.

Upon receipt of the control signal, the spinner driver 22 controls the sub scanning moving means (not shown) to move the spinner mirror unit 16 at a constant speed for scanning. In this way, a two-dimensional image is recorded on the entire recording surface of the recording material 14 by moving the spinner mirror unit 16 in the sub scanning direction while exposure for scanning in the main scanning direction is performed with the spinner mirror unit 16.

Next, the operation of the inner drum exposure apparatus 10 of this embodiment will be described in detail.

In the inner drum exposure apparatus 10 of this embodiment, the semiconductor light source 30 controlled by the central control unit 40 and the laser driver 42 outputs the laser beam L modulated in accordance with the image information and the output laser beam L is then reflected from reflection mirrors 34 and 36, and condensed by the condenser lens 28 before entering the spinner mirror unit 16 (the cube prism 19).

The cube prism 19 forms the incident laser beam L into an oblate ellipsoidal shape with the beam diameter in the main scanning direction reduced The light beam formed into an oblate ellipsoidal shape through the cube prism 19 is then condensed on the recording material 14 to form at the condensing point thereof an oblate ellipsoidal spot in the sub scanning direction. That is, the inner drum exposure apparatus 10 always keeps the state in which a beam is formed into a spot of an oblate ellipsoidal shape and the spot has a steep edge portion and is elongated in the sub scanning direction.

In other words, since exposure is always performed while making the longitudinal direction of the beam spot of the oblate ellipsoidal shape in agreement with the sub scanning direction, an image recorded through the FM screening described above has no change in the perimeter of each recording pixel due to any fluctuations in optical power, and abrupt change of the ratio in a halftone dot image (halftone dot area ratio) is also prevented, which enables consistent halftone recording when the FM screening is used.

Next, an inner drum exposure apparatus according to another embodiment of the present invention will be described.

As in the above-described embodiment, the inner drum exposure apparatus of this embodiment is also characterized in that, in order to allow the halftone to be represented with small dots through FM screening, a light beam is formed into a beam which has an oblate ellipsoidal section and whose beam diameter in the main scanning direction is reduced.

Figure 6:
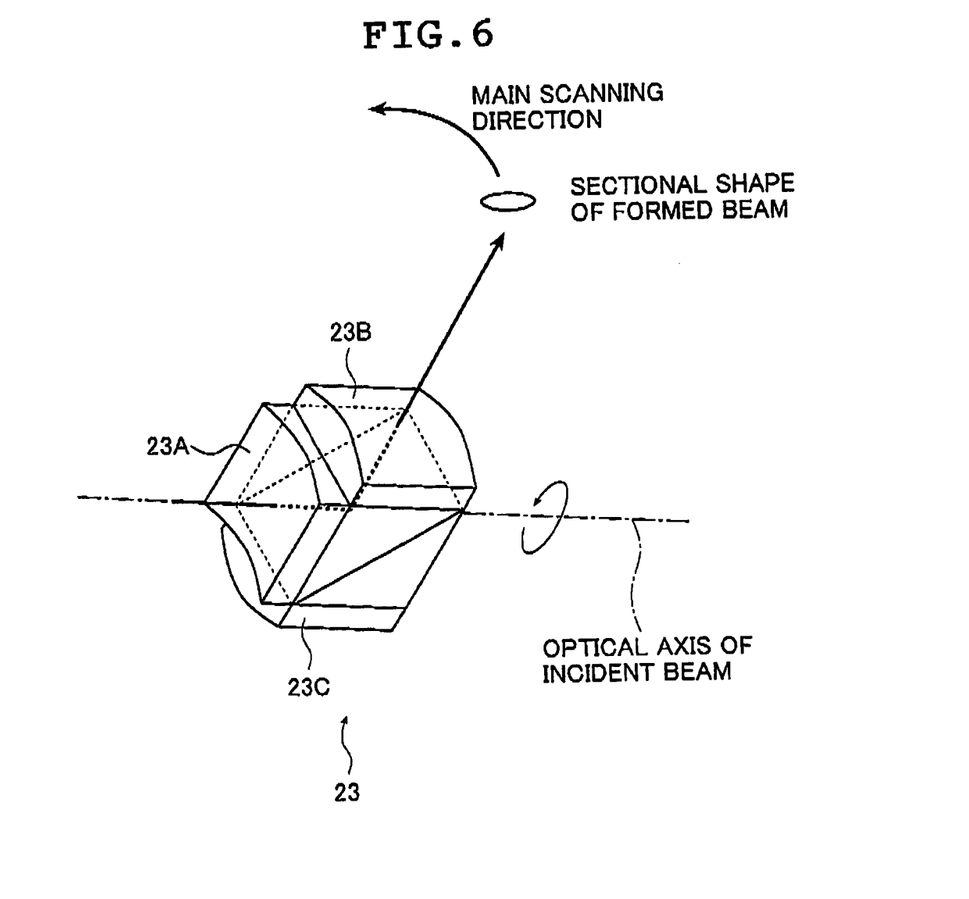
FIG. 6 shows a cube prism used in a spinner mirror unit of an inner drum exposure apparatus according to another embodiment.

The inner drum exposure apparatus of this embodiment differs from the inner drum exposure apparatus 10 of the embodiment shown in FIG. 1 in that the cube prism (see FIG. 3) of the spinner mirror unit 16 of the inner drum exposure apparatus 10 in the embodiment shown in FIG. 1 is replaced by a cube prism 23 as shown in FIG. 6.

The cube prism 19 shown in FIG. 3 has the convex cylindrical lens 21A and the concave cylindrical lens 21B on the light beam incidence side and the light beam emission side, respectively, whereas the cube prism 23 shown in FIG. 6 has a concave cylindrical lens 23A and a convex cylindrical lens 23B on the light beam incidence side and the light beam emission side, respectively.

In the cube prism 23 of this embodiment having been configured as described above, the convex cylindrical lens and the concave cylindrical lens are arranged in opposite positions to those of the cube prism 19. However, the two prisms have substantially the same effect.

More specifically, the cube prism 19 shown in FIG. 3 reduces a beam in one axial direction and then enlarges the reduced beam in the same direction. As a result, a beam diameter is enlarged in the sub scanning direction, whereby a beam with an oblate ellipsoidal section whose beam diameter is smaller in the main scanning direction than in the sub scanning direction is obtained. In contrast, the cube prism 23 shown in FIG. 6 enlarges a beam in one axial direction and then reduces the enlarged beam in the same direction. As a result, a beam diameter is reduced in the main scanning direction, whereby a beam with an oblate ellipsoidal section whose beam diameter is smaller in the main scanning direction than in the sub scanning direction is obtained.

The cube prism 23 shown in FIG. 6 has also a dummy 23C that is substantially identical in shape and weight to the convex cylindrical lens 23B on the light emission side, thereby preventing vibration of the spinner mirror unit during high speed rotation.

Figure 7A:
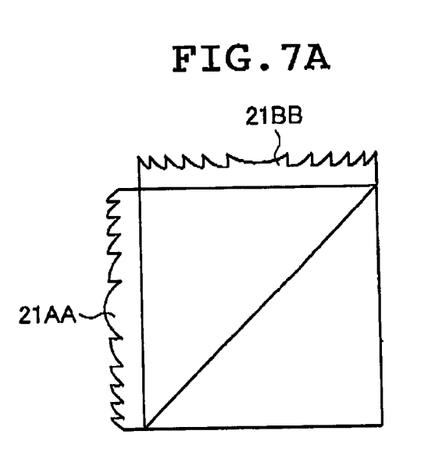
FIGS. 7A and 7B each show a cube prism used in a spinner mirror unit of an inner drum exposure apparatus according to still another embodiment.
Figure 7B:
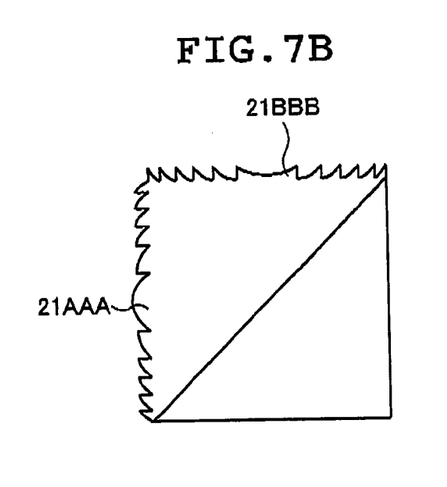

FIGS. 7A and 7B each show a still another embodiment of the present invention. First, in the embodiment shown in FIG. 7A, a Fresnel lens (21AA or 21BB) is formed for at least one of the convex cylindrical lens and the concave cylindrical lens and is then attached to the cube prism body to achieve weight reduction.

It is also possible to directly form the convex and concave cylindrical lenses of Fresnel-type (21AAA or 21BBB) on the surface of the cube prism body, as shown in FIG. 7B. In this case, further weight reduction is of course achieved.

The cube prisms of the two embodiments shown in FIGS. 7A and 7B are substantially identical in their effect to those of the two embodiments in FIGS. 3 and 6, so a detailed description thereof will be omitted.

Figure 8:
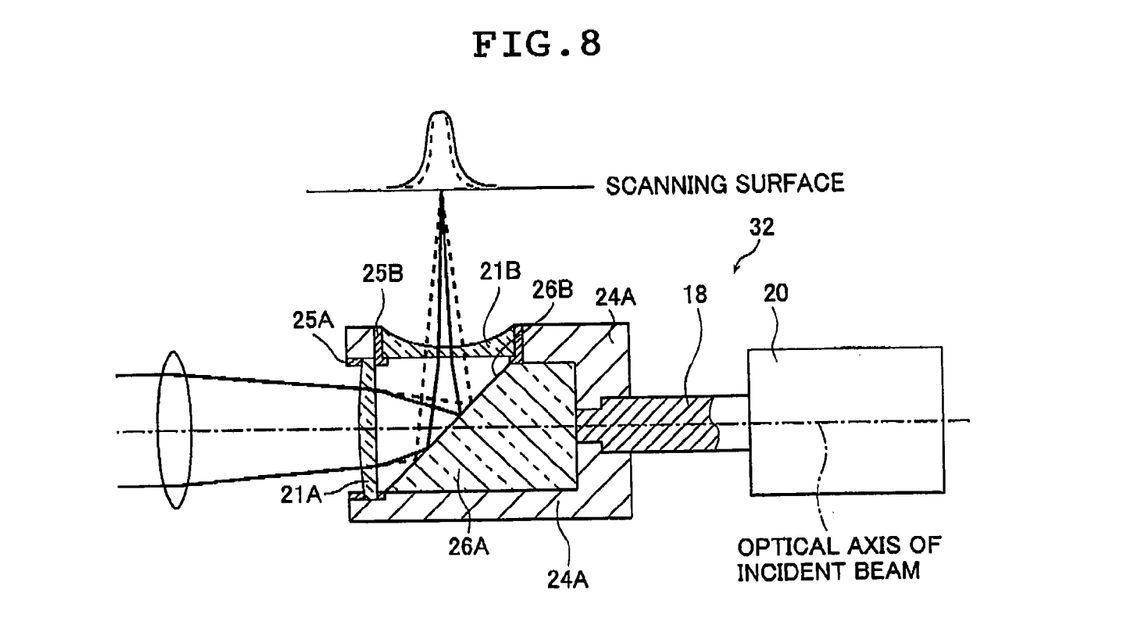
FIG. 8 is a detail view showing the configuration of a spinner mirror unit in an inner drum exposure apparatus according to yet another embodiment.

FIG. 8 shows yet another embodiment of the present invention. In this embodiment, the prism is modified.

More specifically, in a spinner mirror unit 32 of this embodiment, the cube prism 19 shown in FIG. 2 that includes the prism 19A and the prism 19C formed symmetrically with respect to the prism 19A is replaced by a prism 26A with a total reflection mirror plane 26B and a lens holder 24A is provided around the prism 26A.

A first lens holding portion 25A for holding the convex cylindrical lens 21A is formed in front of the lens holder 24A (on the light beam incidence side), and a second lens holding portion 25B for holding the concave cylindrical lens 21B is formed on the side surface of the lens holder 24A (on the light beam emission side).

Although there is a difference in the holding mechanism for the convex cylindrical lens 21A and the concave cylindrical lens 21B, the spinner mirror unit 32 of this embodiment can achieve substantially the same effect as that of the above-described embodiments.

In the spinner mirror unit 32 of this embodiment, the dummy for balance adjustment (as indicated by reference symbol 21C in FIG. 3) may be omitted.

The above-described embodiments are only shown by way of example, and the present invention is not restricted thereto. It goes without saying that various modifications and improvements are possible without departing from the gist of the present invention.

What is claimed is:

1. An inner drum exposure apparatus, comprising:
   a support having an arcuate inner peripheral surface on which a recording material on which an image is recorded is held;
   a light source for emitting a light beam;

modulating means for modulating in accordance with image information of said image said light beam emitted from said light source;

scanning means being rotatably driven and having a total reflection mirror plane, said scanning means for scanning said recording material held on said arcuate inner peripheral surface of said support with said light beam that is modulated in accordance with said image information by said modulating means and deflected by said total reflection mirror plane of said rotatably driven scanning means, wherein said image is recorded on said recording material by scanning said recording material with said modulated light beam, said scanning means comprises:
- a first cylindrical lens for condensing said modulated light beam incident into said total reflection mirror plane along one first plane containing an optical axis of said incident light beam; and
- a second cylindrical lens for diverging said incident light beam along one second plane orthogonal to said one first plane containing said optical axis, and said incident light beam is shaped into a beam spot of an elliptical configuration whose major axis is orthogonal to a beam deflecting/scanning direction by said first cylindrical lens and said second cylindrical lens.

2. The inner drum exposure apparatus according to claim 1, wherein said first cylindrical lens is a convex cylindrical lens and said second cylindrical lens is a concave cylindrical lens.

3. The inner drum exposure apparatus according to claim 1, wherein said first cylindrical lens is a concave cylindrical lens and said second cylindrical lens is a convex cylindrical lens.

4. The inner drum exposure apparatus according to claim 1, wherein said total reflection mirror plane of said scanning means is formed by a prism, and at least one of said first and second cylindrical lenses is directly formed on an incidence/emission surface of said prism.

5. The inner drum exposure apparatus according to claim 1, wherein at least one of said first cylindrical lens and said second cylindrical lens is a Fresnel-type cylindrical lens.

6. The inner drum exposure apparatus according to claim 5, wherein said total reflection mirror plane of said scanning means is formed by a prism, and said Fresnel-type cylindrical lens is attached to a prism surface of said prism of said scanning means.

7. The inner drum exposure apparatus according to claim 5, wherein said total reflection mirror plane of said scanning means is formed by a prism, and said Fresnel-type cylindrical lens is directly formed on a prism surface of said prism of said scanning means.

8. The inner drum exposure apparatus according to claim 1, wherein said scanning means has a balance adjusting member which is substantially identical in weight to said second cylindrical lens and which is provided on a surface of said scanning means opposite to said second cylindrical lens with respect to said optical axis.

* * * * *